(12) United States Patent
Heimbuch et al.

(10) Patent No.: US 8,964,804 B2
(45) Date of Patent: Feb. 24, 2015

(54) VARIABLE BANDGAP MODULATOR FOR A MODULATED LASER SYSTEM

(71) Applicants: Mark Heimbuch, Chatsworth, CA (US); Near Margalit, Westlake Village, CA (US)

(72) Inventors: Mark Heimbuch, Chatsworth, CA (US); Near Margalit, Westlake Village, CA (US)

(73) Assignee: Source Photonics (Chengdu) Co., Ltd., Chengdu (CN)

( * ) Notice: Subject to any disclaimer, the term of this patent is extended or adjusted under 35 U.S.C. 154(b) by 182 days.

(21) Appl. No.: 13/820,102

(22) PCT Filed: Feb. 19, 2013

(86) PCT No.: PCT/CN2013/071659
§ 371 (c)(1),
(2) Date: Feb. 28, 2013

(87) PCT Pub. No.: WO2014/127502
PCT Pub. Date: Aug. 28, 2014

(65) Prior Publication Data
US 2014/0376577 A1    Dec. 25, 2014

(51) Int. Cl.
*H01S 3/10* (2006.01)
*H01S 5/343* (2006.01)
(Continued)

(52) U.S. Cl.
CPC ............ *H01S 5/343* (2013.01); *H01S 5/06213* (2013.01); *H01S 5/06251* (2013.01); *H01S 5/347* (2013.01); *H01S 5/068* (2013.01)
USPC ............ 372/26; 372/46.016; 372/45.01

(58) Field of Classification Search
CPC ... H01S 3/0085; H01S 5/0085; H01S 5/0625; H01S 5/06258; H01S 5/2086; H01S 5/2081; H01S 5/209; H01S 5/2077
USPC .................. 372/26, 46.016, 45.01
See application file for complete search history.

(56) References Cited

U.S. PATENT DOCUMENTS 6,278,170 B1 *  8/2001  Komatsu ............... 257/458
6,611,007 B2     8/2003  Thompson et al.
(Continued)

OTHER PUBLICATIONS

Guy Brammertz, Yves Mols, Stefan Degroote, Maarten Leys, Jan Van Steenbergen, Gustaaf Borghs, and Matty Caymax; "Selective Epitaxial Growth of GaAs on Ge by MOCVD"; Interuniversity Microelectronics Center (IMEC vzw), Kapeldreef 75, B-3001 Leuven, Belgium.

(Continued)

*Primary Examiner* — Kinam Park
(74) *Attorney, Agent, or Firm* — Andrew D. Fortney; Central California IP Group, P.C.

(57) ABSTRACT

A modulated laser system generally includes a light emission region, a modulation region having a plurality of semiconductive layers, at least one of which includes a quantum well layer having a variable energy bandgap, and an isolation region separating the light emission region and the modulation region. The laser may be an electro-absorption modulated laser, the light emission region may include a distributed feedback laser, and the modulation region may include an electro-absorption modulator. The laser may be manufactured by forming a lower semiconductive buffer layer on a substrate, an active layer including one or more quantum well layers having the variable energy bandgap on or above the lower semiconductive buffer layer, an upper semiconductive buffer layer on or above the active layer, a contact layer on or above the upper semiconductive buffer layer, and an isolation region separating the light emission region and the modulation region.

21 Claims, 10 Drawing Sheets

(51) Int. Cl.
  *H01S 5/062* (2006.01)
  *H01S 5/0625* (2006.01)
  *H01S 5/347* (2006.01)
  *H01S 5/068* (2006.01)

(56) References Cited

U.S. PATENT DOCUMENTS

| | | | |
|---|---|---|---|
| 6,614,819 B1 * | 9/2003 | Fish et al. | 372/26 |
| 2009/0003396 A1 | 1/2009 | Codato et al. | |
| 2010/0081225 A1 | 4/2010 | Song et al. | |
| 2011/0249936 A1 * | 10/2011 | Welch et al. | 385/31 |

OTHER PUBLICATIONS

C. F. Gibbon, E. I. Povilonis and D. R. Ketchow; "The Effect of Mask Edges on Dopant Diffusion into Semiconductors"; Journal of the Electrochemical Society; Jun. 1972; pp. 767-772 vol. 119; Issue 6.

Yong-Hwan Kwon, Joong-Seon Choe, Jae-Sik Sim, Sung-Bock Kim, HoGyeong Yun, Kwang-Seong Choi, Byung-Seok Choi, and Eun-Soo Nam; "40 Gb/s Traveling-Wave Electroabsorption Modulator-Integrated DFB Lasers Fabricated Using Seletive Area Growth"; ETRI Journal, vol. 31, No. 6, Dec. 2009; Electronics and Telecommunication Research Institute, Daejeon, Republic of Korea.

B. Zhao, T. R. Chen, A. Shakouri, and A. Yariv; "Performance Improvement in Quantum Well Lasers by Optimizing Band Gap Offset at Quantum Well Heterojunctions"; Appl. Phys. Lett.; vol. 63, No. 4, Jul. 26, 1993; American Institute of Physics.

* cited by examiner

DFB

VARIABLE BANDGAP MODULATOR FOR A MODULATED LASER SYSTEM

FIELD OF THE INVENTION

The present invention generally relates to the field of electro-absorption modulated lasers (EMLs). More specifically, embodiments of the present invention pertain to a variable bandgap electro-absorption modulator (EAM) in an EML that compensates for temperature increases, particularly in high power laser applications.

DISCUSSION OF THE BACKGROUND

Conventional EMLs comprise a distributed feedback laser (DFB) region, an isolation region and an EAM region. The EML is monolithically fabricated such that each region of the EML can be formed on a single substrate through a sequence of epitaxial growth processes. One of the layers of EML device comprises an active region layer. This layer includes a quantum well layer, and more commonly, includes multiple quantum well layers separated by alternating barrier layers. The bandgap of the quantum wells in the DFB region is such that the active region layer emits photons when a certain bias voltage is applied across the DFB. The bandgap of the quantum wells in the EAM region is also selected such that the quantum well layer absorbs photons that are emitted from the DFB region of the EML when a first bias voltage is applied across the EAM region, but allows photons to pass through when a second bias voltage is applied across the EAM region. The isolation region separates the DFB and EAM regions such that the DFB and EAM regions are electrically isolated from one another.

FIG. 1 illustrates a conventional modulated laser 100 comprising light emission region 110, isolation region 120 and modulator region 130. Manufacturing modulated laser 100 may include forming lower semiconductive buffer layer 150 on a substrate 140, forming active region layer 160 on or above the lower semiconductive buffer layer 150, forming upper semiconductive buffer layer 170 on or above active region layer 160, forming contact layer 180a-b on or above upper semiconductive buffer layer 170, and forming isolation layer 190 on or over the active region layer 160 and upper semiconductive buffer layer 170 in isolation region 120 separating the light emission region 110 and modulation region 130.

In high power EML applications, an appreciable amount of energy is generated by the absorption of photons in the EAM region. A relatively greater amount of this energy is dissipated in the portion of the EAM active region closest to the isolation region (i.e., where photons emitted from the light emission region are first incident), in comparison to the portions of the EAM active region farther away from the isolation region. This comparatively greater amount of power dissipation in the closer portion of the EAM region results in a temperature increase that causes a shift in the bandgap energy of the quantum wells in that portion, and the generation of sub-regions of varying bandgap energies during "steady state" operation of the EML. Consequently, the relatively close portion of the EAM region absorbs photons at an inconsistent rate when a constant voltage is being applied to the entire EAM active region.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to a variable bandgap modulator adapted for temperature compensation and a method for fabricating the same. The present invention is particularly suitable for high power EML applications. A semiconductor laser according to embodiments of the present invention generally comprises a light emission region, a modulation region comprising a plurality of semiconductive layers, at least one of which comprises one or more quantum well layers having a variable energy bandgap, and an isolation region separating the light emission region and the modulation region.

A method of manufacturing a semiconductor laser having a light emission region and a modulation region according to embodiments of the present invention generally comprises forming a lower semiconductive buffer layer on a substrate, forming an active region layer on or above the lower semiconductive buffer layer, wherein the active layer comprises one or more quantum well layers having a variable energy bandgap, forming an upper semiconductive buffer layer on or above the active region layer, forming a contact layer on or above the upper semiconductive buffer layer, and forming an isolation layer at or in an interface region of the active region layer and the upper semiconductive buffer layer, the isolation region separating the light emission region and the modulation region.

Another method of manufacturing a semiconductor laser having a light emission region and a modulation region according to embodiments of the present invention generally comprises forming a lower contact layer on a substrate, forming a plurality of semiconductive layers including an active region layer on the lower contact layer and optionally on the substrate to form the light emission region, etching a portion of the active region layer and optionally the lower contact layer, forming additional layers including a modulation active region layer having a variable energy bandgap to form a modulation region, forming an upper contact layer on or above the active region layers, and etching a portion of the upper contact layer and the active region layer at an interface between the light emission region and modulation region to form an isolation region.

The present invention advantageously provides an EAM quantum well layer with consistent bandgap energies when a portion of the EAM is operating at a relatively high temperature (e.g., in a steady state). As such, the present invention provides a device and method that address issues that arise in other such devices wherein the temperature profile within the EAM varies and results in inconsistent or unexpected operation qualities.

These and other advantages of the present invention will become readily apparent from the detailed description of various embodiments below.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "laser," "EML," "light source," and "laser diode" are generally used interchangeably herein, but are generally given their art-recognized meanings. Also, for convenience and simplicity, the terms "light-absorption," "modulator," "modulation region" and "electro-absorption modulator" may be used interchangeably, but these terms are also generally given their art-recognized meanings. The terms "thickness" or "height" may also be used interchangeably, but both, in the context of this application, are meant to refer to a vertical measurement with reference to a horizontal surface. The terms "variable energy bandgap," "variable bandgap energy" or "variable bandgap" are also generally interchangeable, but refer to a property or characteristic of a structure, rather than a particular substance or material.

The present invention concerns a variable bandgap modulator configured to compensate for performance differences as a result of a temperature differential across the modulation region. The present invention is particularly suitable for temperature compensation in a high power EML application. The invention, in its various aspects, will be explained in greater detail below with regard to exemplary embodiments that achieve or provide variable bandgap energies in the modulation region of a semiconductor laser.

An Exemplary Modulated Laser

In one aspect, the present invention relates to a semiconductor laser comprising a light emission region, a modulation region comprising a plurality of semiconductive layers, at least one of which comprises one or more quantum well layers having a variable energy bandgap, and an isolation region separating the light emission region and the modulation region. In various embodiments, the semiconductor laser may comprise an EML, the light emission region may comprise a DFB, and the modulation region may comprise an EAM.

Figure 1:
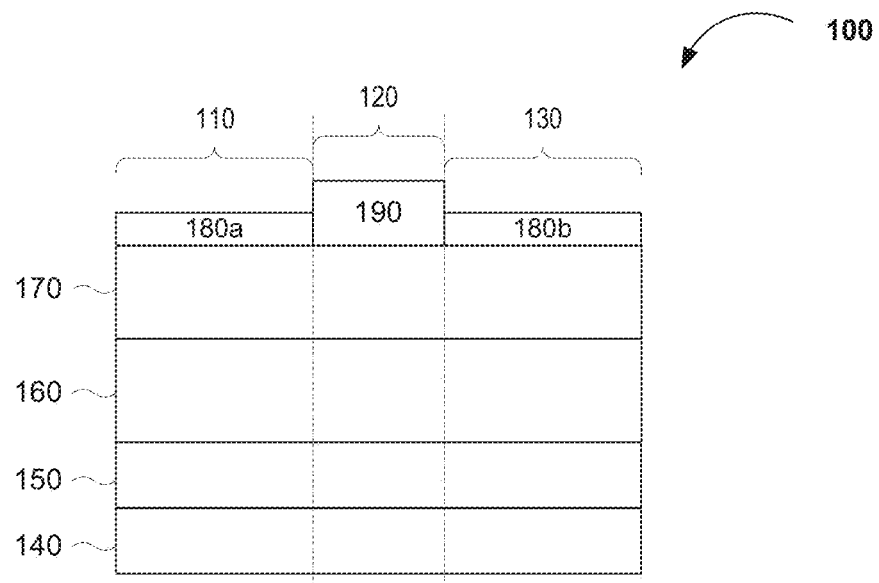
FIG. 1 is a diagram showing a conventional EML.
Figure 2:
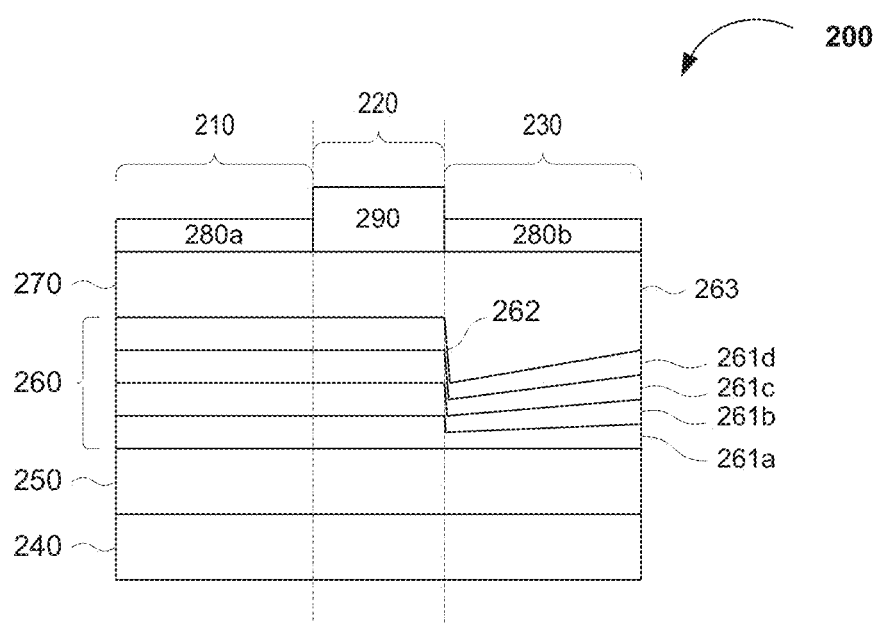
FIG. 2 is an exemplary embodiment of an EML according to the present invention.

FIG. 2 illustrates a modulated laser 200 embodying the present invention. Modulated laser 200 comprises a light emission region 210, an isolation region 220 and a modulation region 230. The modulated laser 200 comprises a substrate 240, a lower semiconductive buffer layer 250, an active region layer 260 with a fixed bandgap energy in the light emission region 210 and a variable bandgap energy in the modulation region 230, an upper semiconductive buffer layer 270, a contact layer 280a-b and an isolation layer 290. More specifically, the active region layer 260 within the modulation region 230 comprises quantum well layers 261a-d that have a variable bandgap energy. The variable bandgap energy may be achieved in the quantum well layers 261a-d by varying the thickness of the quantum well layers 261a-d across the modulation region 230. In the embodiment shown in FIG. 2, the thickness is at a minimum at the interface 262 with the isolation region 220, and gradually increases across the modulation region 230.

In the present invention, an active region layer 260 with a variable bandgap energy in the modulation region 230 is particularly applicable to high power semiconductor laser applications. At an interface 262 between the isolation region 220 and the modulation region 230, the portion of the active region layer 260 closest to the interface 262 is subject to greater amounts of light absorption, and thus greater power dissipation, causing a relatively large increase in temperature and/or a relatively large shift in the bandgap energy within that region of the quantum well layers 261a-d. When the quantum well layers 261a-d have a variable bandgap energy, the variable bandgap energy can normalize and achieve a consistent bandgap energy during steady state operations of the laser, even with a temperature non-uniformity present.

In general, the modulation region 230 has a first boundary 262 closest to the isolation region and a second boundary 263 farthest from the isolation region. As illustrated in FIG. 2, the first boundary 262 is the side of the modulation region 230 closest to the isolation region 220. The second boundary 263 represents the side of the modulation region 230 opposite to the first boundary 262. The variable energy bandgap of the quantum well layers 261a-d may have a gradient along a direction from the first boundary 262 to the second boundary 263. The bandgap gradient may be negative or decreasing along that direction. Alternatively, there may be stepwise decreases in the bandgap energy in quantum well layers 261a-d from the first boundary 262 to the second boundary 263.

Stated differently, the quantum well layers 261a-d have an energy bandgap that varies across a lateral dimension measured from a boundary or interface 262 closest to the isolation region 220 to another boundary or interface 263 farthest from the isolation region 220. Areas closest to the isolation region 220 will have bandgap energy that is greater than the bandgap energy in areas farther from the isolation region 220. Preferably, the increase in bandgap energy in any given area will be equal or about equal to the amount of bandgap distortion that the same area would experience due to power dissipation in the semiconductor laser 200. Power dissipation in an area of the quantum well layers 261a-d is directly related to the operating temperature in that area. Thus, preferably, when the semiconductor laser is operating in a steady state, the increase in bandgap energy in an affected area of the quantum well layers 261a-d will be equal or about equal to any expected or experienced decrease in bandgap energy in that affected area due to a relatively higher operating temperature. Therefore, preferably, the increase in the bandgap energy at room temperature (or when the semiconductor laser 200 is off) offsets some or all of an expected decrease in the bandgap energy during steady state operation of the semiconductor laser 200. In some embodiments, the variable energy bandgap of the quantum wells 261a-d is inversely proportional to a distance along a direction from the first boundary 262 to the second boundary 263. In other embodiments, the variable energy bandgap of the quantum wells 261a-d can be directly proportional to an amount of power dissipated as a function of the distance along the direction from the first boundary 262 to the second boundary 263.

A variable energy bandgap of the quantum well layers 261a-d may be achieved by varying the thickness of the quantum well layers 261a-d. The variable thickness may be a thickness gradient along the direction from the first boundary 262 to the second boundary 263. Preferably, the gradient is positive, such that the thickness increases along that direction.

Figure 3:
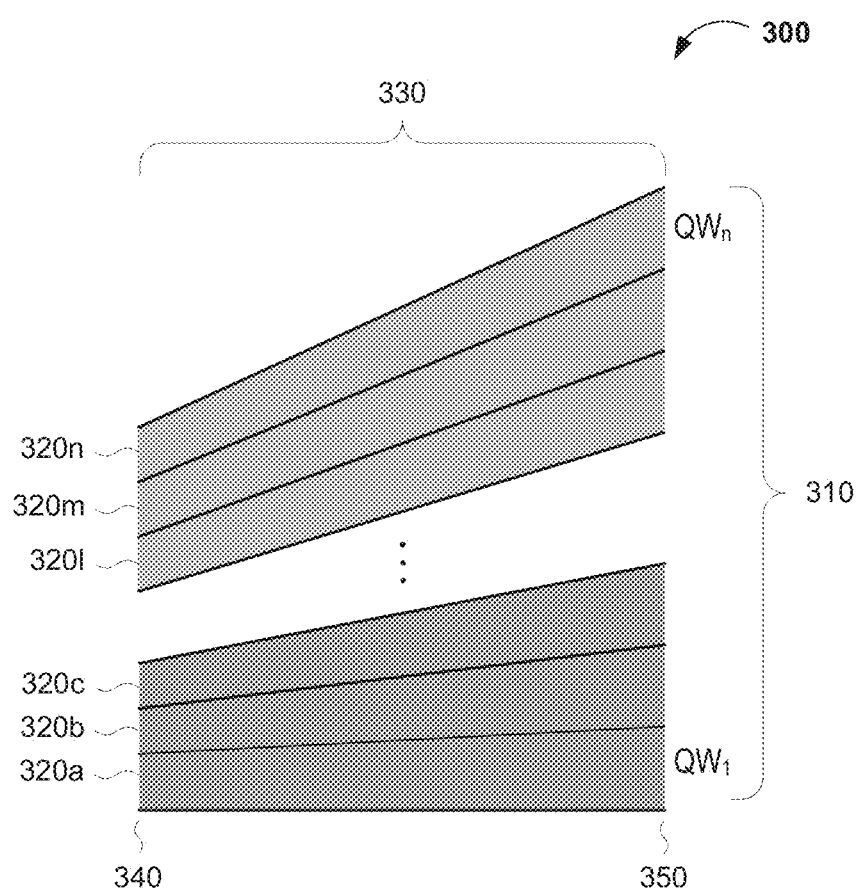
FIG. 3 is an exemplary embodiment of an active region layer of an EAM according to the present invention.

FIG. 3 illustrates an active region 300 within a modulation of a semiconductor laser according to the present invention. Active region layer 310 represents some or all of active region layer 260 in FIG. 2 that is within a modulation region 330, which may be the same as or different from modulation region 230 in FIG. 2. Active region layer 310 comprises n quantum well layers 320a-n, where n is an integer equal to greater than 6. The use of multiple quantum well layers enhances the photon absorption effect within the modulation region 330. FIG. 3 illustrates only one possible embodiment, where the number of quantum well layers is at least 6 (6 layers are shown for illustrative purposes), but the number of quantum well layers can be any integer value equal to or greater than 1. According to the first exemplary embodiment, each of the quantum well layers 320a-n may have a thickness profile as illustrated in FIG. 3 that varies along a lateral distance from a first boundary 340 to a second boundary 350, where the thickness increases along a linear direction from the first boundary 340 to the second boundary 350, thus providing the variable bandgap energy. Alternatively, one or more of the quantum well layers 320a-n have a thickness profile similar to that shown in FIG. 3, and one or more quantum layers (not shown) have a relatively constant thickness profile.

Figure 4A:
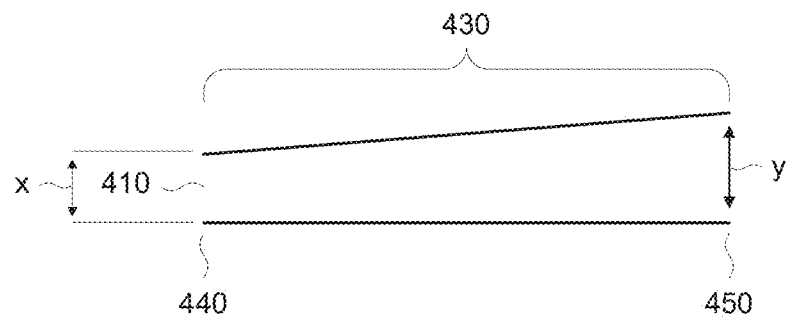
FIGS. 4A-4C are exemplary embodiments of a single quantum well layer according to the present invention.
Figure 4B:
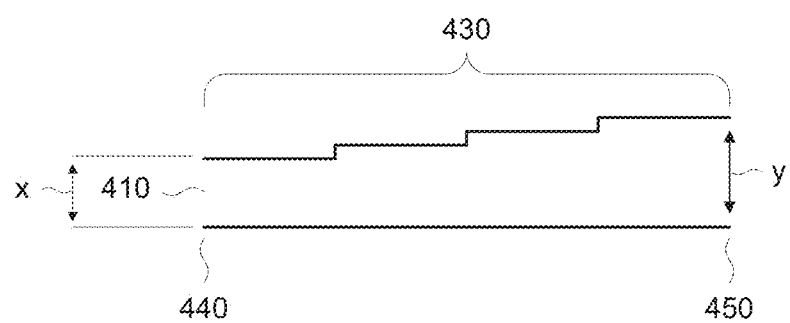
Figure 4C:
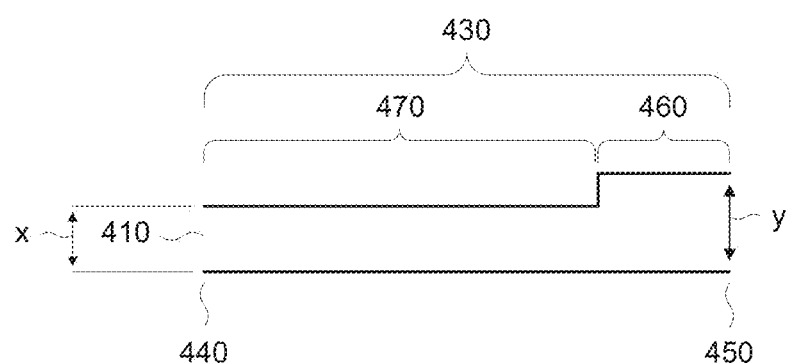

FIGS. 4A-4C illustrate a single quantum well layer QW1 410, which may be the same as the quantum layer QW1 320a in FIG. 3. Quantum well layer QW1 410 has a thickness X at a first end 440, and a thickness Y at a second end 450 opposite to the first end 440. As is apparent from FIGS. 4A-4C, X has a value that is less than Y, but the difference in value is not necessarily to scale. X and Y may each have a value ranging from 1 nm to 100 nm (or any value or range of values therein), and the value of X may be from 10% to 95% (or any percentage or range of percentages therein) of the value of Y. At the first end 440, the operating temperature of the quantum well layer is greater than the operating temperature at the second end 450. It should be noted that FIGS. 3 and 4A-4C do not illustrate the exclusive embodiments in which the thickness of the quantum well layers 320a-n are varied. The variation in thickness, aside from being linear as shown in FIG. 4A, may be non-linear, such as a step function as shown in FIG. 4B, or in a single step as shown in FIG. 4C, where the thickness is relatively low in the high-absorption area 460, and relatively high in a bulk region or remainder 470 of the modulation region 330 (FIG. 3).

Referring to FIGS. 4A-4C, the steady state operating temperature at the first end 440 is the highest because it is the area where photons from the light emission region 210 (FIG. 2) are first incident. The increased temperature at the first end 440 is also dependent on the operating voltage of the semiconductor laser. The higher the operating voltage, the higher the observed increase or difference in steady state operating temperature (delta T).

Figure 5A:
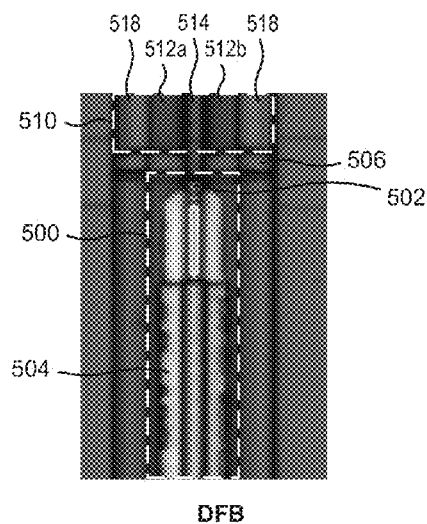
FIGS. 5A-5C are scanning electron microscope (SEM) images of an exemplary EML highlighting light emission, isolation, and EAM regions, respectively.
Figure 5B:
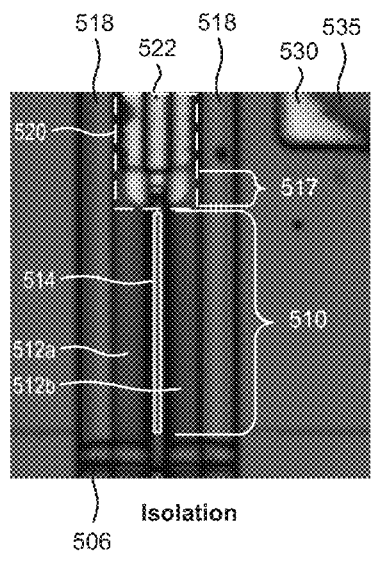
Figure 5C:
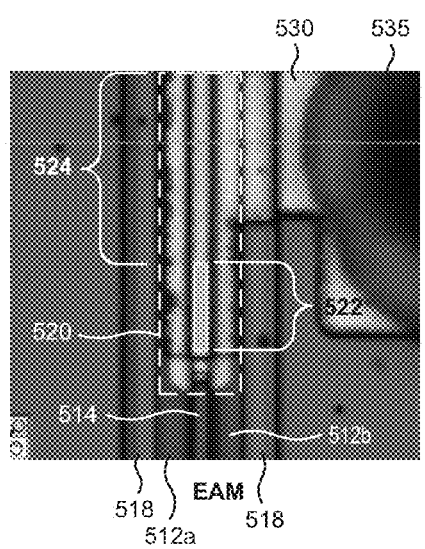

FIGS. 5A-5C are SEM photos showing the light emitting device 500, isolation region 510, and modulation region 520 of an actual EAM-DFB semiconductor laser. FIG. 5A depicts the light emission region 502 of light emitting device 500, a first contact 504 for the light emitting device 500, an isolation interface 506, and various areas of the isolation region 510, including parts of an unmasked area 514, a masked area 512, and a base area 518. A bias current is applied to light emitting device 500 via contact 504, then light is emitted from area 502 and directed toward isolation region 510. Thus, in various embodiments, light emitting device 500 may comprise a DFB laser, an edge emitting laser, quantum cascade laser, optical fiber laser, a combination thereof, etc.

FIG. 5B depicts the isolation region 510 and a portion of the high-absorption area 522 in the modulation region 520 including an unmasked area 514, masked areas 512a-b, and the base area 518, as well as the isolation interface 506 and a front of the modulation region 520. Masked areas 512a-b and unmasked area 514 generally function to allow the light generated by light emission region 502 to pass through to modulation region 520 without significant absorption and to electrically isolate light emission region 502 and modulation region 520 from each other.

FIG. 5C depicts the modulation region 520, including the front high-absorption area 522, a bulk area 524, a second contact 530, and a wire bond 535 for the modulation region 520. Parts of the masked areas 512a-b and unmasked area 514 of isolation region 510 and of the base area 518 are also shown. To determine the effect of light absorption in different areas of the modulation region 520, the temperature is averaged separately over the light emission region 502, isolation region 510, high-absorption area 522, and bulk area 524 of the modulation region 520. Contact 530 may also facilitate measurement of the average temperature in high-absorption area 522 and bulk area 524.

For example, when a bias voltage of −2V is applied across the modulation region 520 and a bias current of 100 mA is applied to light emission region 502, the delta T (the difference between the average temperature of the high-absorption area 522 and the thermoelectric cooler [TEC] temperature setting) is 12° C. Alternatively, when a bias voltage of −3V is applied across the modulation region 520 and a bias current of 150 mA is applied to light emission region 502, the delta T is 53° C. Thus, in relatively high power semiconductor laser applications, compensating for increased steady state operating temperatures in the high-absorption area 522 of the modulation region 520 becomes even more important in order to obtain uniform modulation throughout the active layer region 310 (FIG. 3). Table 1 below outlines the correlation between the delta T of the high absorption area 522 and the power dissipated in the high-absorption area 522 ("Power"):

TABLE 1

| Test | TEC temp | DFB bias | EAM bias | Isolation ΔT | EAM ΔT | DFB ΔT | EAM current (mA) | Power |
|---|---|---|---|---|---|---|---|---|
| 7 | 25 | 150 | −3 | 8.2 | 67 | 12.2 | 39 | 117 |
| 3 | 70 | 150 | −3 | 10.5 | 66 | 14.6 | 30 | 90 |
| 8 | 40 | 100 | −3 | 7 | 43.8 | 8 | 23.2 | 69.6 |
| 4 | 75 | 150 | −3 | 12.1 | 77.1 | 13.5 | 22.5 | 67.5 |
| 2 | 65 | 150 | −3 | 12.2 | 68 | 12 | 21 | 63 |
| 5 | 85 | 150 | −3 | 10.4 | 53 | 10.6 | 20 | 60 |
| 3 | 70 | 150 | −2 | 10.6 | 41.6 | 13.4 | 29.5 | 59 |
| 4 | 75 | 150 | −2 | 10.5 | 52.9 | 14.1 | 26 | 52 |
| 5 | 65 | 150 | −2 | 8.8 | 36.4 | 12.1 | 23.2 | 46.4 |
| 8 | 40 | 100 | −2 | 3.9 | 12.2 | 6.5 | 21.2 | 42.4 |
| 1 | 60 | 100 | −2 | 6.7 | 24.3 | 6.5 | 20 | 40 |
| 6 | 85 | 100 | −3 | 8.6 | 35 | 7.3 | 13 | 39 |
| 2 | 65 | 150 | −2 | 9.1 | 50.9 | 12.5 | 19 | 38 |
| 6 | 85 | 100 | −2 | 8.9 | 20 | 6.3 | 15 | 30 |
| 8 | 40 | 100 | −1 | 2.5 | 1.7 | 6.4 | 12.4 | 12.4 |

Table 1 lists the EAM delta Ts for different DFB bias currents ("DFB bias"), EAM bias voltages ("EAM bias"), and TEC temperature settings ("TEC temp"). It becomes apparent from the difference ("EAM ΔT") in average surface temperature at the high-absorption area 522 (e.g., the front 20 μm of the modulation region 520 under the contact 530; "20 μm ave surface measured") and the TEC temperature setting ("EAM ΔT") that the high-absorption area 522 experiences significantly greater operating temperatures than the TEC temperature setting ("TEC temp"). The bandgap energy of semiconductor materials tends to decrease with increasing temperatures. This phenomenon is described by the following equation: $E_g(T)=E_g(0)-[\alpha T^2]/[T+\beta]$, where $E_g(0)$, $\alpha$ and $\beta$ are constants of the semiconductor material. Therefore, when the high-absorption area 522 has a relatively high operating temperature, it will also have a decreased bandgap in comparison to the expected bandgap at the TEC temperature setting.

Figure 6A:
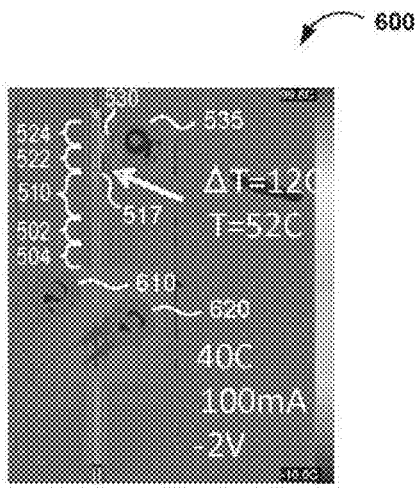
FIGS. 6A-6C are thermal images of an exemplary EML, including temperature readings of a portion of the EAM region nearest to an isolation region at different ambient temperature, laser current, and EAM voltage conditions.
Figure 6B:
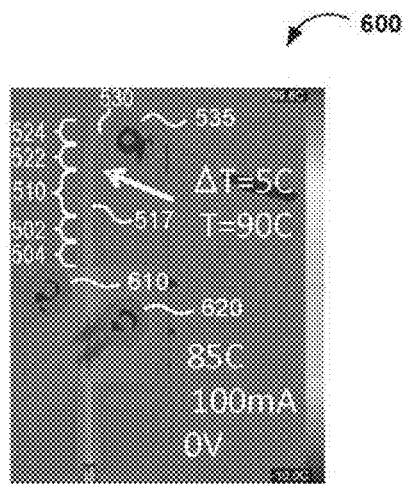
Figure 6C:
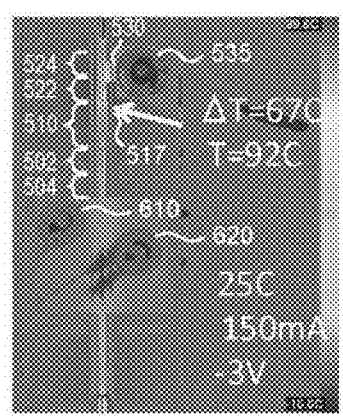

The thermal images illustrated in FIGS. 6A-6C depict the effect that power dissipation has on the temperature delta, or increase in temperature, that is observed at the high-absorption area 522 of modulation region 520. FIGS. 6A-6C show images of the EML device of FIGS. 5A-5C (labeled 600 in FIGS. 6A-6D), including light emitting device 502/504, isolation region 510 and the modulation region 522/524. FIG. 6A shows an image of the EML 600 when operating EML 600 with the TEC set to 40° C., the light emitting device 500 bias current set to 100 mA, and the modulation region bias voltage set to −2V. At these settings, the average temperature of the high-absorption area 522 is 52° C., and the temperature delta between the high-absorption area 522 and the TEC temperature setting is 12° C.

FIG. 6B shows an image of the same EML device 600, but operating with the TEC set to 85° C., the light emitting device 500 bias current set to 100 mA, and the modulation region bias voltage set to 0V. The resulting high-absorption area 522 average temperature is 90° C., and the temperature delta between the high-absorption area 522 and the TEC is only 5° C., indicating that little or no power is dissipated at a modulator voltage of 0V.

FIG. 6C shows another image of the same EML device 600, but operating with the TEC set to 25° C., the light emitting device 500 bias current set to 150 mA, and the modulation region bias voltage set to −3V. The resulting high-absorption area 522 average temperature is 92° C., and the temperature delta between the high-absorption area 522 and the TEC is 67° C.

Figure 7:
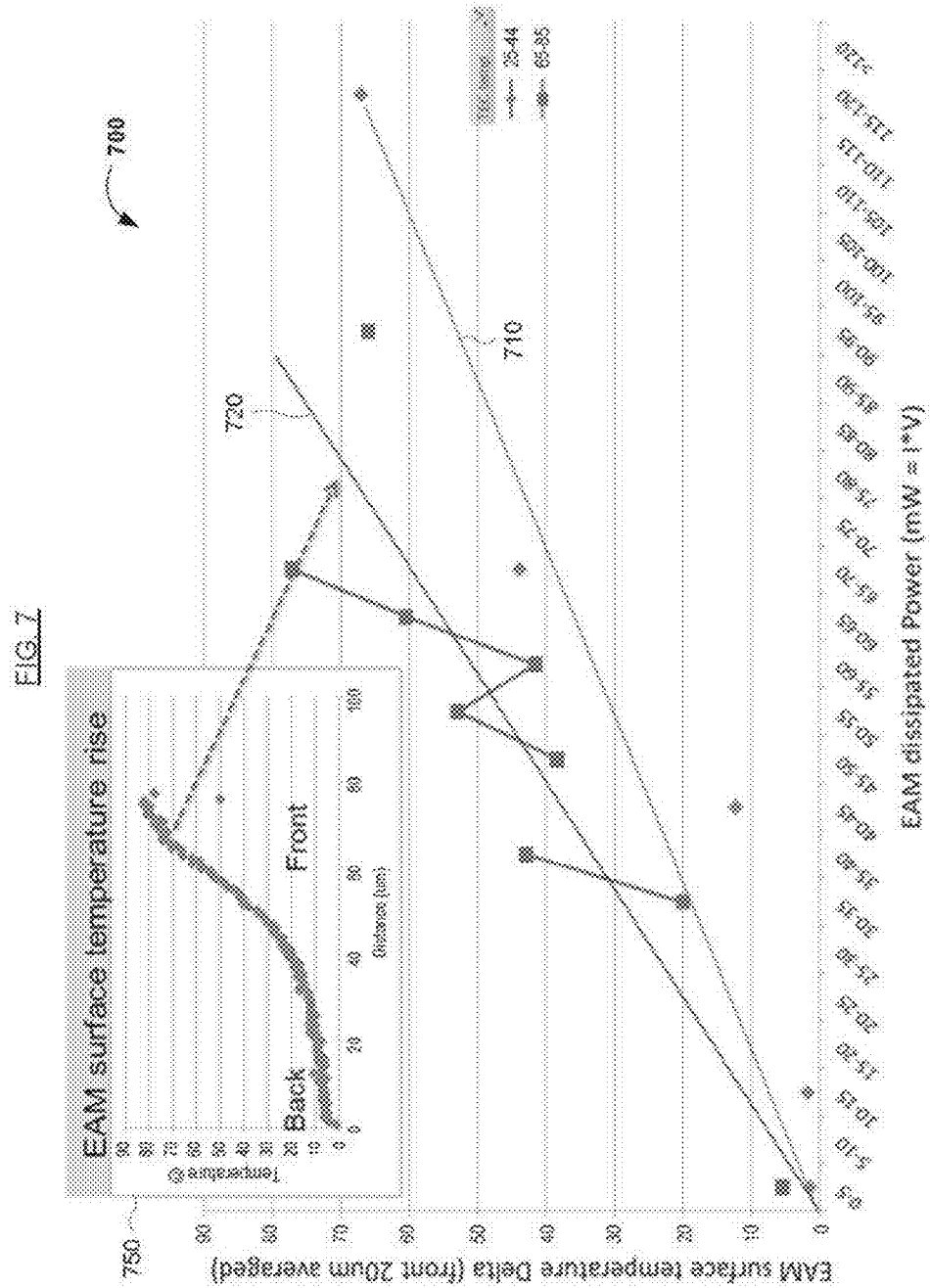
FIG. 7 shows two graphs, the primary graph showing the EAM surface temperature against the EAM dissipated power at two different operating points for an exemplary EML made in accordance with the present invention, and the embedded graph showing the EAM surface temperature as a function of the distance into the EAM from the isolation region.

The graphs in FIG. 7 further outline the relationship between the temperature delta between the high-absorption area 522 (i.e., the first 20 μm of the modulation region 520 closest to the light emitting device 500) and the TEC temperature setting, and the amount of dissipated power in the modulation region 520. As the dissipated power increases, the temperature delta in the high-absorption area 522 of the modulation region 520 also increases. The main graph 700 provides two trend lines 710 and 720. The top line 720 is for a higher range (i.e., 65-85° C.) of TEC temperature settings, and the bottom line 710 is for a lower range of TEC temperature settings (i.e., 25-44° C.). A comparison between lines 710 and 720 shows that the temperature delta is higher with higher TEC temperature settings. This is due to higher light absorption by the EAM as a result of the bandgap being closer to the lasing condition at higher temperatures.

The embedded graph 750 shows the temperature at the surface of the modulator. It is a temperature plot along the modulation region 520 as a function of the distance from the end of the modulator region 520 most distant from the isolation region 510. Using this data, the temperatures across the front 20 μm of the modulation region 520 are averaged and then compared to the TEC temperature setting. A lower bandgap energy in the high-absorption area 522 of the modulator region 520 due to a higher operating temperature may adversely affect performance of the modulator and/or laser. A delta T of 80° C. is equivalent to about 28 nm of bandgap change that from the front to the back of the EML 520 in order to keep the quantum well behavior uniform across the whole modulation region. In addition, reducing the absorption of the quantum wells at the very front of the modulation region 520 can spread out the temperature profile as shown in graph 750 of FIG. 7 to be less steep.

Referring back to FIG. 3, and in accordance with the relationship between temperature and power dissipation described above, the quantum well layers 320a-n may have a variable thickness that is about inversely proportional to the temperature gradient and/or the dissipated power as a function of distance from the interface between the quantum well layers 320a-n and the isolation region 220 (FIG. 2) when the device is in a steady state of operation, such that the thickness of the quantum well layers 320a-n increases from the first boundary 340 to the second boundary 350, but does not exceed the thickness of the quantum well layer(s) in the laser/light-emitting region (e.g., region 210 in FIG. 2). Thus, areas of quantum well layers 320a-n that are subject to relatively high temperatures, and thus relatively greater decreases in their bandgap energies, may have a lesser thickness, and thus greater initial bandgap energy, to compensate for the bandgap energy decreases expected at relatively high operating temperatures.

In a further embodiment, quantum well layers 320a-n may have a variable doping profile, or doping gradient, that achieves a variable energy bandgap. The variable doping profile may be represented by a dopant concentration or dose gradient along the direction from the first boundary 340 to the second boundary 350. The variable doping profile may also correlate to the temperature gradient and/or dissipated power as a function of distance from the interface between the isolation region 220 (FIG. 2) and the quantum well layers 320a-n, as explained above. Therefore, areas of quantum well layers 320a-n that experience relatively greater temperatures, and thus relatively greater decreases in their bandgap energies, may have an adjusted doping profile, and thus greater initial bandgap energy, to compensate for the bandgap energy decreases experienced at relatively greater operating temperatures.

Varying the doping profile may include moving (e.g., changing the depth of) a depletion region or intrinsic region of a PIN junction through the quantum well layers 320a-n using a process such as diffusion of zinc or other P-type impurity. In such quantum well layers 320a-n, a photocurrent will not be generated and power dissipation can be eliminated. However, there may be excess loss from any quantum well(s) (e.g., 320a) that may have been moved into the underlying P doped region (e.g., P-doped semiconductor region 250 in FIG. 2).

Alternatively, if the PIN intrinsic region (I-region) is made thicker, then, for the same applied voltage, the electric field across the quantum wells 320a-n is reduced, and this in turn reduces the absorption per unit length of the EAM region (e.g., region 230 in FIG. 2), which reduces the current per unit length, which in turn reduces the power consumption per unit length. A thick I-region is easiest to make in a stepped fashion with multiple re-growths, as explained above and shown in FIGS. 4A-4C.

An Exemplary Method

The present invention further relates to a method of manufacturing a semiconductor laser having a light emission region and a modulation region, comprising forming a lower semiconductive buffer layer on or above a substrate, forming an active region layer on or above the lower semiconductive buffer layer, forming an upper semiconductive buffer layer on or above the active region layer, forming a contact layer on or above the upper semiconductive buffer layer, and forming an isolation layer in at least part of the active region layer and the upper semiconductive buffer layer. The active layer comprises one or more quantum well layers having a variable energy bandgap (e.g., as discussed above), and the isolation region separates the light emission region and the modulation region. The isolation region is generally formed at an interface between the light emission region and the modulation region.

Figure 8A:
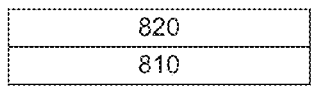
FIGS. 8A-8E are diagrams showing an exemplary method for manufacturing an EML according to the present invention.

FIGS. 8A-8E illustrate one exemplary method of forming a semiconductor laser device with variable energy bandgap quantum well layer(s) in the modulator region. In FIG. 8A, a lower semiconductive buffer layer 820 is formed on a substrate 810. Generally, the substrate 810 comprises a non-conducting or semi-insulating material. For example, substrate 810 may provide a physical support for the semiconductor laser and modulator, and have a surface with a crystallographic orientation enabling subsequent growth of semiconductive and/or active layer(s). For example, the substrate 810 may comprise a semi-insulating or non-conducting II-VI or compound (e.g., CdSe, ZnS, ZnO, InP, GaAs, etc.) or Group IV element or alloy (e.g., Si, Ge, SiGe, etc.). Alternatively, substrate 810 may comprise an insulating substrate such as $SiO_2$, $Al_2O_3$, SiC, quartz, garnet, etc. The substrate 810 may be a sheet, slip or wafer of single-crystal, partially-crystalline or amorphous material, or comprise a polycrystalline film on an amorphous or partially-crystalline insulating or semi-insulating material. Substrate 810 may have a thickness from about 5 µm to about 500 µm (e.g., 100 nm), or any value or range of values therein.

Lower semiconductive buffer layer 820 may comprise or consist essentially of a compound semiconductor (e.g., a non-conducting or semi-insulating II-VI or III-V material such as CdSe, ZnS, ZnO, InP, GaAs, combinations thereof, etc.), and be formed by epitaxial growth and/or chemical vapor deposition (e.g., metal organic chemical vapor deposition, or MOCVD) from known precursors under known deposition conditions. Substrate 810 may be cleaned prior to deposition of lower semiconductive buffer layer 820 according to known techniques. Each of the substrate 810 and the lower semiconductive buffer layer 820 may contain a sufficient dose of n-type and/or p-type dopant to provide it with reliable and/or reproducible semi-insulative or intrinsic properties. In some embodiments, the lower semiconductive buffer layer 820 has a crystallographic structure that substantially matches that of the substrate 810 or of the uppermost surface of the substrate 810. Lower semiconductive buffer layer 820 may have a thickness from about 100 nm to about 10,000 nm, or any value or range of values therein. In one embodiment, the lower semiconductive buffer layer 820 may be doped with a P-type dopant (e.g., with P, As, Sb, Zn, Cd, Be, Mg, Ca, etc.)

Figure 8B:
Figure 8C:
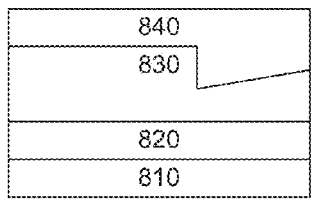

In FIG. 8B, an active region layer 830 is formed on or above the lower semiconductive buffer layer 820, wherein the active region layer 830 comprises one or more quantum well layers having a variable bandgap energy (e.g., as shown in FIGS. 2-4). Forming the active region layer 830 may comprise selective area growth (SAG) and/or selective area epitaxy (SAE) through or onto a mask (see FIGS. 11A-12B and the discussion thereof below). SAG and/or SAE may comprise growing or depositing alternating layers of first and second different materials (e.g., InP and InGaAs). The alternating layers of the first and second semiconductive materials may also be deposited by metal-organic vapor-phase epitaxy (MOVPE), metal-organic chemical vapor deposition (MOCVD), or metal-organic molecular beam epitaxy (MOMBE). Additionally, SAG and/or SAE may further include forming a mask having one or more variable width portions when forming the quantum well layers on the lower semiconductive buffer layer 820 (or underlying quantum well layer; see the discussion of FIGS. 9-11B below).

Each quantum well layer may comprise alternating layers of different materials. In general, each quantum well layer comprises or consists essentially of lower and upper layers, each comprising a first semiconductor material, and an inner layer comprising a second, different semiconductor material. The first semiconductor material preferably has a larger bandgap energy than the second semiconductor material. In various embodiments, the first and second semiconductor materials are a composite III-V or II-VI semiconductor material (e.g., AlInAs, InGaAs, InGaN, InGaAlAs, InGaAsP, InGaP, InAsP, InGaAsP, etc.). One example of the second material is $In_{x1}Ga_{1-x1}As_{y1}P_{1-y1}$, and an example of the first material is $In_{x2}Ga_{1-x2}As_{y2}P_{1-y2}$, where x1 does not equal x2, and y1 does not equal y2. Therefore, a single quantum well layer generally includes alternating layers of second and first semiconductor materials that have different bandgap energies, thereby achieving the desired absorption of photons when a given bias voltage is applied to the modulator. However, in preferred embodiments, the active region layer 830 comprises multiple quantum well layers (e.g., from 2 to 100 quantum well layers, or any range of values therein, such as 10). The thickness of the inner semiconductor layer may range from 10 to 1000 Å, while the thickness of the upper and lower semiconductor layers may range from 20 to 2000 Å. Generally, the thickness of the upper and lower semiconductor layers will be greater than that for the inner semiconductor layer.

Figure 10:
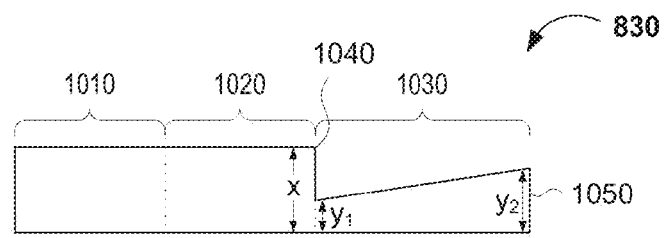
FIG. 10 is a cross-sectional view illustrating a variable quantum well thickness the active region layer in the modulator region of an EML that is formed using a method of manufacturing according to the present invention.

FIG. 10 depicts a cross sectional view of the active region layer 830 (see, e.g., FIG. 8). The thickness, or height, of the active region layer 830 varies within the modulation region 1030. The active region layer 830 at a first boundary 1040 between the isolation region 1020 (FIG. 10) has a thickness X, while the active region layer 830 (FIG. 8) at a first boundary or interface 1040 with isolation region 1020 has a thickness $Y_1$ and at a second boundary 1050 (FIG. 10) farthest from the first boundary 1040, has a thickness $Y_2$. From FIG. 10, is it clear that the value of X is greater than the values of $Y_1$ and $Y_2$, and that the value of $Y_2$ is greater than the value of $Y_1$. The thickness of the active region layer 830 in modulation region 1030 continuously increases in the direction from the first boundary 1040 to the second boundary 1050. Thus, the bandgap energy, as it relates to thickness of the quantum well layers in the active region layer 830 (FIG. 8), is greater at the first boundary 1040 than at the second boundary 1050. Although the increase in thickness (and thus the decrease in bandgap energy) is shown in FIG. 10 as being continuous and/or linear from the first boundary 1040 and the second boundary 1050, the increase in thickness or decrease in bandgap energy may be discontinuous from the first boundary 1040 to the second boundary 1050, such that the increase in thickness from $Y_1$ to $Y_2$ occurs in one or more steps.

The width of the mask used in depositing the active region layer 830 (FIG. 8B; e.g., by SAG or SAE) influences the thickness of the quantum well layer(s) created in the exposed area in the mask. A mask (or set of masks) having an opening surrounded by regions of varying (e.g., tapered) surface area leads to greater diffusion of the deposited material from the mask into the opening from regions having a greater width or area. Therefore, in order to obtain the desired thickness of the quantum well layer being formed, the width, and thus the surface area, of portions of the mask being used during deposition may be adjusted.

Figure 11A:
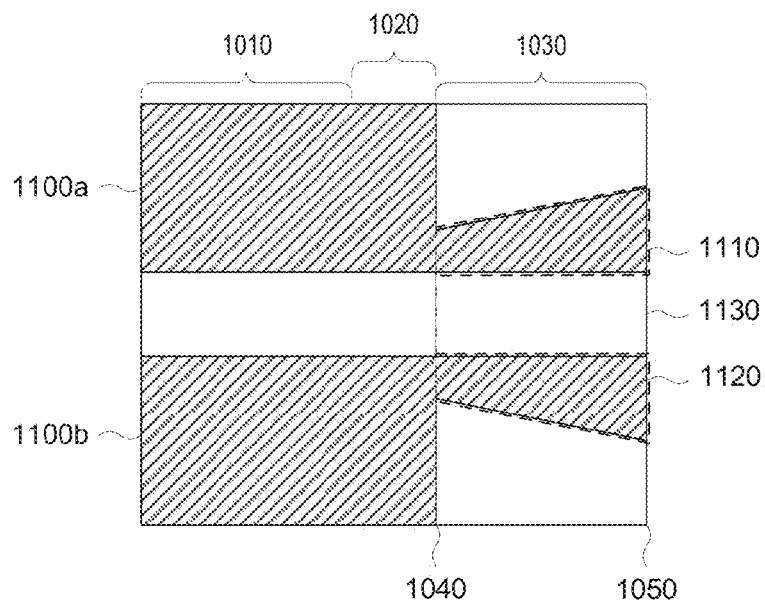
FIGS. 11A-11B are diagrams showing exemplary masks for forming an active region layer of an EAM according to the present invention where the DFB and EAM quantum wells are grown at the same time.

FIG. 11A shows one such mask 1100a-b, comprising a first strip 1110 and a second strip 1120 in the modulation region 1030. A width of each of the first and second strips 1110 and 1120 increases along a direction from the first boundary 1040 closest to the isolation region 1020 to a second boundary region 1050 farthest from the isolation region 1020. Additionally, the width of the first strip 1110 may be approximately equal to the width of the second strip 1120 along the same direction. Alternatively, the first strip 1110 and the second strip 1120 may have widths that are different or that vary independently.

In another embodiment, the method of varying the thickness of a semiconductive layer includes varying the width of the opening between the mask strips. The greater the width of the opening, the less diffusion of material into the opening will occur, and vice versa (i.e., the smaller the width of the opening, the more material will diffuse into the opening in that area), leading to a greater thickness. Alternatively, if dimensions of the mask and the active regions are selected appropriately, a mask with an increasingly wider opening from the first boundary to the second boundary permits fewer ions to be implanted in the active region. Following diffusion of the implanted ions, the dose of implanted ions in the narrow area of the opening is effectively smaller per unit area than the dose of implanted ions in the wider area of the opening, thereby reducing the bandgap of the quantum well layers in the narrow area of the opening.

Figure 11B:
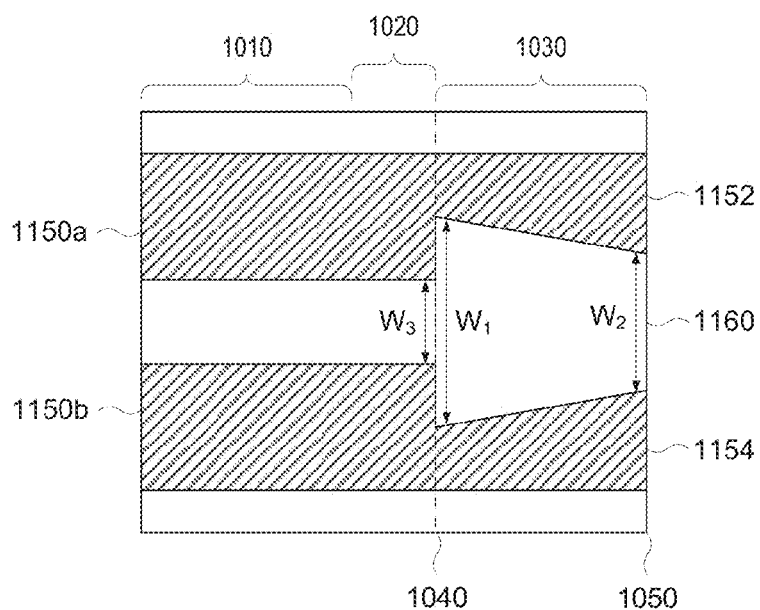

As illustrated in FIG. 11B, the width of the opening 1160 may decrease along a direction from the first boundary 1040 at the interface between the modulation region 1030 and the isolation to the second boundary 1050. The first strip 1152 and the second strip 1154 expose an active area 1160 having a variable width that may be approximately inversely proportional to the widths of the first strip 1152 and/or second strip 1154 along the same direction. The width of the opening 1160 between the first strip 1152 and the second strip 1154 varies in the modulation region 1030. Thus, the first width $W_1$ of the opening 1130 closer to the interface 1040 with the isolation region 1020 is greater than the second width $W_2$ of the opening 1160 at the second boundary 1050. Furthermore, the width $W_2$ is greater than a third width $W_3$ between the masks 1150a and 1150b. Therefore, the width of opening 1160 decreases from the width $W_1$ at the first boundary 1040 to the width $W_2$ at the second boundary 1050, but not to a width equal to or less than the width $W_3$ between the masks 1150a and 1150b. Again, the method of varying the width along the modulation region is one possibility. The width may be varied such that the change is other than linear, such as by one or more steps.

In both FIGS. 11A and 11B, the portions 1110/1120 of the mask 1100 and 1152/1154 of the mask 1150, respectively, within the modulation region 1030 have a variable width. FIGS. 11A and 11B are two examples of how the width of the mask 1100 or 1150 may vary, but other approaches and/or methods of varying the width of the mask 1100/1150 (which may involve non-linearly varying masks) may be employed. In both FIGS. 11A and 11B the width of the portions 1110/1120 and 1152/1154, respectively, vary in a constant or linear fashion, but, as explained in FIGS. 4A-4C, if a non-linear profile is desired, then the width of the masks 1100 and 1150 may also be varied accordingly.

Forming the active region layer 830 (FIG. 8B) may therefore further comprise masking the lower semiconductive buffer layer 820 (FIG. 8B) with a mask having a first strip (e.g., 1110 or 1152) and a second strip (e.g., 1120 or 1154) in the modulation region 1030, and forming the active region layer 830 (FIG. 8A) in the modulation region 1030 in an opening (e.g., 1130 or 1160) between the first and second strips.

Referring back to FIG. 8C, an upper semiconductive buffer layer 840 is formed on or above the active region layer 830. Upper semiconductive buffer layer 840 may be formed by blanket depositing a III-V type semiconductor (e.g., InP, GaAs, etc.), a II-VI type semiconductor (e.g., CdSe, ZnS, etc.), or a Group IV semiconductor (e.g., silicon and/or germanium), then implanting one or more dopants into the semiconductor or diffusing the dopant(s) into the semiconductor material from a solid or vapor dopant source. The dopant(s) are then activated, typically by furnace or laser annealing. In one embodiment, upper semiconductive buffer layer 840 comprises a III-V semiconductor compound (e.g., InP). Upper semiconductive buffer layer 840 may have a thickness from about 20 nm to about 10,000 nm, or any value or range of values therein. In one embodiment, the upper semiconductive buffer layer 840 may be doped with an N-type dopant (e.g., with B, Al, Be, Mg, Ca, Si, etc.)

Figure 8D:
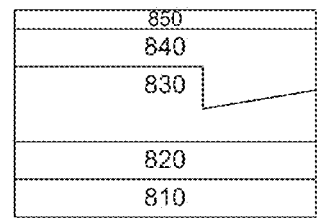

Referring now to FIG. 8D, a contact layer 850 is formed on or above the upper semiconductive buffer layer 840. If the contact layer 850 is formed as a continuous layer, the contact layer 850 may be patterned (e.g., by photolithography and chemical etching, or by laser etching) to form first and second upper contacts 852 and 854 (see FIG. 8E). Alternatively, first and second contacts 852 and 854 may be formed directly by printing, thus avoiding the extra photolithography and etching steps. Referring back to FIG. 8D, contact layer 850 may comprise a conductive material such as a metal (e.g., Al, Cu, Ag, Au, etc.), an alloy of two or more metals (e.g., Au/Cr, Au/Pt/Ti, or Au/Ge), a semiconductor (e.g., a II-VI, III-V or Group IV semiconductor as described herein, which may be doped [e.g., heavily or very heavily] with an N-type [e.g., P, Sb, As, etc.] or P-type dopant [e.g., boron]), and/or a conductive metal compound (e.g., TiN, TiSi$_x$, WSi$_x$, TiSi$_x$N$_y$, WSi$_x$N$_y$, indium tin oxide [ITO], etc.). Contact layer 850 may be formed by blanket deposition (e.g., by CVD, sputtering, evaporation, or MOCVD) and have a thickness from about 100 nm to about 5,000 nm, or any value or range of values therein.

Figure 9A:
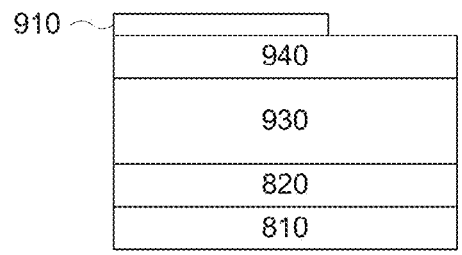
FIGS. 9A-9C illustrate exemplary steps in an alternative method for manufacturing an EML according to the present invention.
Figure 9B:
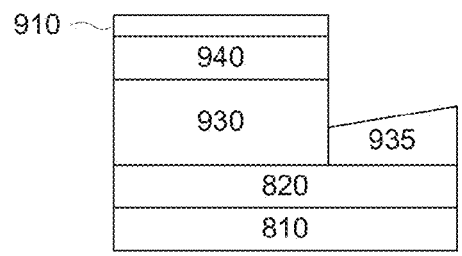
Figure 9C:
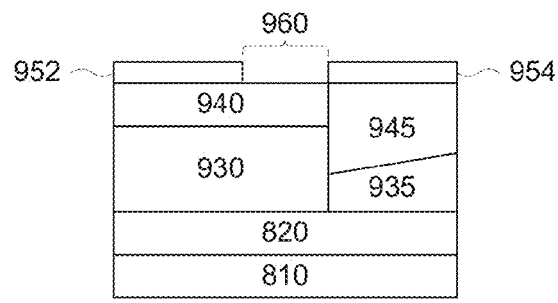

FIGS. 9A-9C illustrate an alternate method of forming an active region layer within the modulation region 1030. Referring to FIG. 9A, and starting from FIG. 8A, active region layer 930 and upper semiconductive layer 940 may uniformly be grown in succession on lower semiconductive layer 820 by the methods described herein for active region (e.g., quantum well containing) layers and upper/lower semiconductive buffer layers. A mask 910 may then be formed on or above a portion of the upper semiconductive buffer layer 940 in the light emission region 1010. Next, the exposed portion(s) of the layers 930 and 940 above an etch-stop layer (not shown, but generally on lower semiconductive buffer layer 820) are removed by etching (e.g., wet etching or dry [e.g., plasma] etching).

In FIG. 9B, with the mask 910 still in place above the light emission region 1010, layers for the modulation region 1030 are successively formed, generally by epitaxial growth and/or deposition. The layers for modulation region 1030 include a second active region layer 935 and a second upper semiconductive buffer layer 945.

The second active region layer 935 includes the quantum well layers (e.g., layers 320a-n shown in FIG. 3) having variable bandgap energy, as described herein. The method of forming the second active region layer 935 may be as described above, or in the alternative, in a series or sequence of deposition or growth (and optional etching) steps. The latter may involve forming the quantum well layers in the modulation region 1030 in any number of deposition or growth and etch steps, as opposed to a single continuous deposition or growth of the second active region layer 935. If separate steps are performed, then the energy bandgap of some or all of the quantum well layers may be varied such that the energy bandgap is greater in an area closest to the interface between the light emission region 1010 and the modulation region 1030 than the area(s) farther away from the interface.

Figure 12A:
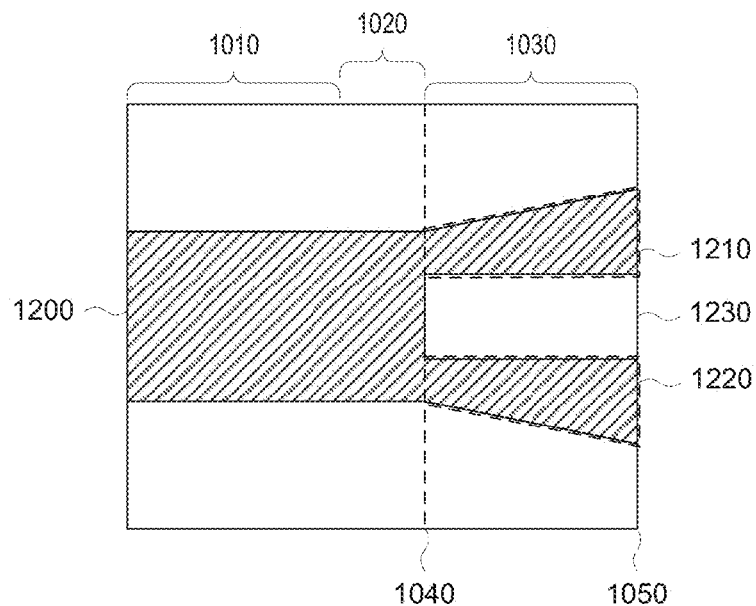
FIGS. 12A-12B are diagrams showing other exemplary masks for forming an active region layer of an EAM according to the present invention where the EAM quantum wells are re-grown after the DFB quantum wells have been grown.

FIG. 12A shows an alternative mask 1200 for forming active region layer 935 comprising a first strip 1210 and a second strip 1220 in the modulation region 1030. The width of each of the first and second strips 1210 and 1220 increases along the direction from the first boundary 1040 closest to the isolation region 1020 to the second boundary 1050, and the width of the first strip 1210 is approximately equal to the width of the second strip 1220 along that direction. The mask 1200 in FIG. 12A differs from the mask 1100a-b in FIG. 11A in that the opening 1130 between the first and second strips 1110 and 1120 extends all the way through the masks 1100a-b, but mask 1200 blocks all deposition in the light-generating region of the light-emitting region 1010 and the light transmitting region of the isolation region 1020. Such a mask may be advantageous for minimizing topographical and/or topological issues between the light emitting region 1010, the isolation region 1020, and the modulation region 1030.

In another embodiment, the method of varying the thickness of a semiconductive layer includes varying the width of the opening between the mask strips. The greater the width of the opening, the less diffusion of material into the opening will occur, and vice versa (i.e., the smaller the width of the opening, the more material will diffuse into the opening in that area), leading to a greater thickness. Alternatively, if dimensions of the mask and the active regions are selected appropriately, a mask with an increasingly wider opening from the first boundary to the second boundary permits fewer ions to be implanted in the active region. Following diffusion of the implanted ions, the dose of implanted ions in the narrow area of the opening is effectively smaller per unit area than the dose of implanted ions in the wider area of the opening, thereby reducing the bandgap of the quantum well layers in the narrow area of the opening.

Figure 12B:
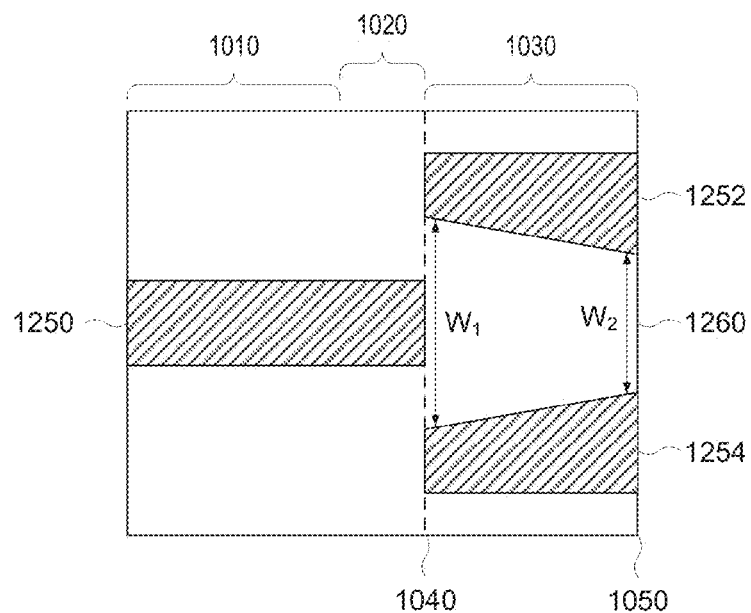

As illustrated in FIG. 12B, the width of the opening 1260 may decrease along a direction from the first boundary 1040 at the interface between the modulation region 1030 and the isolation to the second boundary 1050. The first strip 1252 and the second strip 1254 expose an active area 1260 having a variable width that may be approximately inversely proportional to the widths of the first strip 1252 and/or second strip 1254 along the same direction. The width of the opening 1260 between the first strip 1252 and the second strip 1254 varies in the modulation region 1030. Thus, the first width W$_1$ of the opening 1230 closer to the interface 1040 with the isolation region 1020 is greater than the second width W$_2$ of the opening 1260 at the second boundary 1050. Again, the method of varying the width along the modulation region is one possibility. The width may be varied such that the change is other than linear, such as by one or more steps.

In both FIGS. 12A and 12B, the portions 1210/1220 of the mask 1200 and 1252/1254 of the mask 1250, respectively, within the modulation region 1030 have a variable width. FIGS. 12A and 12B are two examples of how the width of the mask 1200 or 1250 may vary, but other approaches and/or methods of varying the width of the mask 1200/1250 (which may involve non-linearly varying masks) may be employed. In both FIGS. 12A and 12B the width of the portions 1210/1220 and 1252/1254, respectively, vary in a constant or linear fashion, but, as explained in FIGS. 4A-4C, if a non-linear profile is desired, then the width of the masks 1200 and 1250 may also be varied accordingly.

Forming the active region layer 935 (FIG. 9B) may therefore further comprise masking the lower semiconductive buffer layer 820 (FIG. 9B) with a mask with a first strip (e.g., 1210 or 1252) and a second strip (e.g., 1220 or 1254) in the modulation region 1030, and forming the active region layer 935 (FIG. 9B) in the modulation region 1030 in an opening (e.g., 1230 or 1260) between the first and second strips.

In FIG. 9C, when the second active region layer 935 has been formed in its entirety, the second upper semiconductive buffer layer 945 can be formed in a similar or same manner as layers 940 in the light emission region 1010. Optionally, the second upper semiconductive buffer layer 945 may be planarized (e.g., by polishing, such as chemical mechanical polishing) prior to further processing.

Figure 8E:
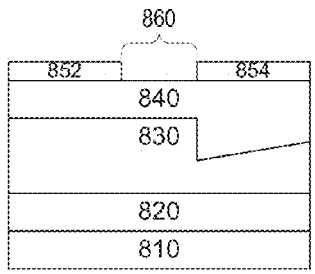

In FIG. 8E, an isolation region 860 is formed or defined by removing part of the contact layer 850, and implanting an isolation ion in the exposed area of the active region layer 830 and the lower semiconductive buffer layer 820. For example, the isolation region 860 may be formed by applying a mask over portions of the contact layer 850 that are not to be removed, and then etching the exposed portion of the contact layer 850. The etch process may comprise wet etching or dry etching. One such dry etching technique that may be performed is reactive ion etching (RIE). After etching the exposed portion of contact layer 850, an isolation ion (e.g., H$^+$, He, etc.) may be implanted into the exposed upper semiconductive buffer layer 840 and active region layer 830 therebelow (and optionally into lower semiconductive buffer layer 820) to disrupt the semiconductor lattice in each such layer and convert the layer(s) into semi-insulative or insulating layers. An annealing step may be performed to repair any damage resulting from the previous etch and implant steps.

Although not shown, in addition to removing the exposed portion of the contact layer 850, portions of the upper semiconductive buffer layer 840 and the active region layer 830 may also be etched using the same or different etch process and/or chemistry as for the contact layer 850 (as well as for each other) to form a trench or trough in isolation region 860 through the upper semiconductive buffer layer 840 and part or all of the active region layer 830. Also, depending on the depth of the etch required, an additional stop etch layer (not shown) may be formed to achieve a desired etch depth and remove only those layers or portions thereof sufficient to form an effective isolation trench or trough, while leaving those layers below the stop etch layer (not shown) undisturbed. Optionally, when all of the active region layer 830 is removed, part or all of the lower semiconductive buffer layer 820 therebelow may be removed using the same or different etch process and/or chemistry. When part or all of the lower semiconductive buffer layer 820 (and optionally part of the active region layer 830) remains after etching to define and/or form the trench or trough in isolation region 860, the isolation ion can be implanted into the area exposed by the trench or trough as described above.

CONCLUSION/SUMMARY

Thus, the present invention provides a variable bandgap modulator for a modulated laser system and methods for manufacturing the same. By providing a variable bandgap modulator, the present invention compensates for performance differences as a result of a temperature differential across the modulation region.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. Embodiments were chosen and described in order to best explain the principles of the invention and its practical applications, to thereby enable others skilled in the art to best utilize the invention and its various embodiments with various modifications as are suited to the particular use(s) contemplated. It is intended that the scope of the invention be defined by the Claims appended hereto and their equivalents.

What is claimed is:

1. A semiconductor laser comprising:
a light emission region;
a modulation region comprising a plurality of semiconductive layers, at least one of which comprises one or more quantum well layers having a variable energy bandgap; and
an isolation region separating said light emission region and said modulation region.

2. The device of claim 1, wherein said modulation region has a first boundary closest to said isolation region and a second boundary farthest from said isolation region, and said variable energy bandgap has a bandgap or bandgap gradient that decreases from said first boundary to said second boundary.

3. The device of claim 2, wherein an energy of said variable energy bandgap along said bandgap gradient is approximately inversely proportional to a distance from said first boundary and/or approximately proportional to an amount of power dissipated at said distance.

4. The device of claim 1, wherein said modulation region has a boundary closest to said isolation region, and said one or more quantum well layers has a variable thickness that is approximately proportional to a distance from said boundary and/or approximately proportional to an amount of power dissipated at said distance.

5. The device of claim 1, wherein said modulation region has a first boundary closest to said isolation region, and said one or more quantum well layers have a variable thickness that is about inversely proportional to a temperature gradient over said one or more quantum well layers when said device is in a steady state of operation that increases from said first boundary to a second boundary farthest away from said isolation region.

6. The device of claim 1, wherein said one or more quantum well layers has a variable doping profile.

7. A method of manufacturing a semiconductor laser having a light emission region and a modulation region, comprising:
forming a lower semiconductive buffer layer on a substrate;
forming an active layer above said lower semiconductive buffer layer, wherein said active layer in said modulation region comprises one or more quantum well layers having a variable energy bandgap;
forming an upper semiconductive buffer layer above said active region layer;
forming a contact layer above said upper semiconductive buffer layer; and
forming an isolation layer in areas of said active layer and said upper semiconductive buffer layer separating said light emission region and said modulation region.

8. The method of claim 7, wherein said modulation region has a first boundary closest to said isolation region and a second boundary farthest from said isolation region, and said variable energy bandgap comprises a bandgap gradient that decreases from said first boundary to said second boundary.

9. The method of claim 8, wherein an energy of said variable energy bandgap along said bandgap gradient is approximately inversely proportional to a distance from said first boundary and/or about proportional to an amount of power dissipated at said distance.

10. The method of claim 7, wherein said modulation region has a first boundary closest to said isolation region, and said one or more quantum well layers have a variable thickness that is approximately proportional to a distance from said boundary and/or approximately proportional to an amount of power dissipated at said distance.

11. The method of claim 7, wherein forming said active layer comprises selective area growth (SAG) or selective area epitaxy (SAE).

12. The method of claim 11, wherein said SAG or said SAE comprises forming a mask having first and second strips with variable widths on said lower semiconductive buffer layer.

13. The method of claim 12, wherein said modulation region has a first boundary closest to said isolation region and a second boundary farthest from said isolation region, and said variable widths of said first and second strips increases along a direction from said first boundary to said second boundary.

14. The method of claim 13, wherein said variable width of said first strip is approximately equal to said variable width of said second strip at any point along said direction.

15. The method of claim 7, wherein forming said active layer further comprises masking first and second strips on said lower semiconductive buffer layer in the modulation region, and forming said quantum well layer having said variable bandgap energy in the modulation region in an opening between said first and said second strips.

16. The method of claim 15, wherein forming said active layer comprises growing a semiconductor material on or over said lower semiconductive buffer layer using metal-organic vapor phase epitaxy (MOVPE) or metal-organic chemical vapor deposition (MOCVD).

17. The method of claim 15, wherein a width of said opening decreases along said direction.

18. The method of claim 15, wherein a width of said opening is proportional to a width of each of said first and second strips along said direction.

19. The method of claim 15, wherein a width of said opening along said direction is uniform or constant.

20. The method of claim 7, wherein said one or more quantum well layers have a variable doping profile.

21. The method of claim 7, wherein said modulation region has a first boundary closest to said isolation region and a second boundary farthest from said isolation region, and said one or more quantum well layers have a variable thickness that is approximately inversely proportional to a temperature gradient over said one or more quantum well layers when said device is in a steady state of operation that increases from said first boundary to said second boundary.

\* \* \* \* \*